United States Patent [19]

Wagner

[11] 4,321,553

[45] Mar. 23, 1982

[54] WIDE BANDWIDTH LOW DISTORTION AMPLIFIER

[75] Inventor: Gary L. Wagner, Menlo Park, Calif.

[73] Assignee: Ford Aerospace & Communications Corp., Detroit, Mich.

[21] Appl. No.: 22,584

[22] Filed: Mar. 21, 1979

[51] Int. Cl.³ .............................................. H03F 3/30
[52] U.S. Cl. .................................. 330/265; 330/295; 330/311
[58] Field of Search ............... 330/147, 148, 263, 265, 330/295, 311

[56] References Cited

U.S. PATENT DOCUMENTS

| | | | |
|---|---|---|---|
| 2,761,917 | 9/1956 | Aronson | 330/270 |
| 2,788,493 | 4/1957 | Zawels | 332/45 |
| 2,860,193 | 11/1958 | Lindsay | 330/273 |
| 2,955,257 | 10/1960 | Lindsay | 330/266 |
| 2,955,259 | 10/1960 | Lax | 330/290 |
| 2,959,741 | 11/1960 | Murray | 330/273 |
| 3,040,264 | 6/1962 | Weidner | 330/290 |
| 3,114,112 | 12/1963 | Cuchran | 330/265 |
| 3,195,064 | 7/1965 | Offner | 330/265 |
| 3,204,191 | 8/1965 | Redwoud, Jr. | 330/282 |
| 3,239,770 | 3/1966 | Taber | 330/271 |
| 3,258,704 | 6/1966 | Wittman | 330/263 |
| 3,260,947 | 7/1966 | Dorsman | 330/258 |
| 3,372,344 | 3/1968 | Hafler | 330/298 |
| 3,500,218 | 3/1970 | Burwen | 330/11 |
| 3,594,652 | 7/1971 | Springer | 330/262 |
| 3,628,166 | 12/1971 | Harford | 330/145 X |
| 3,745,477 | 7/1973 | Freeburn | 330/263 X |
| 3,803,503 | 4/1974 | Greatman | 330/265 |
| 3,852,678 | 12/1974 | Frye | 330/265 |
| 4,112,386 | 5/1978 | Everhart et al. | 330/265 |

FOREIGN PATENT DOCUMENTS

| | | | |
|---|---|---|---|
| 2159095 | 5/1973 | Fed. Rep. of Germany | 330/254 |
| 1425925 | 2/1976 | United Kingdom | 330/311 |
| 543136 | 2/1977 | U.S.S.R. | 330/265 |

Primary Examiner—James B. Mullins
Attorney, Agent, or Firm—Edward J. Radlo; Robert D. Sanborn; Clifford L. Sadler

[57] ABSTRACT

An amplifier is disclosed which is capable of operation from 0 MHz to over 100 MHz with very low distortion over this entire range. Several inputs may be combined without affecting the gain of the amplifier. Several outputs may be combined without adding to the distortion products significantly. A pair of common-base symmetrically juxtaposed transistors drives a pair of symmetrical common-emitter transistors. An AC and DC feedback loop is provided along the line of symmetry. In addition, each symmetrical half of the set of four transistors has a DC feedback loop which balances current between stages of said half and inhibits overcurrent conditions in the transistors of that half.

10 Claims, 1 Drawing Figure

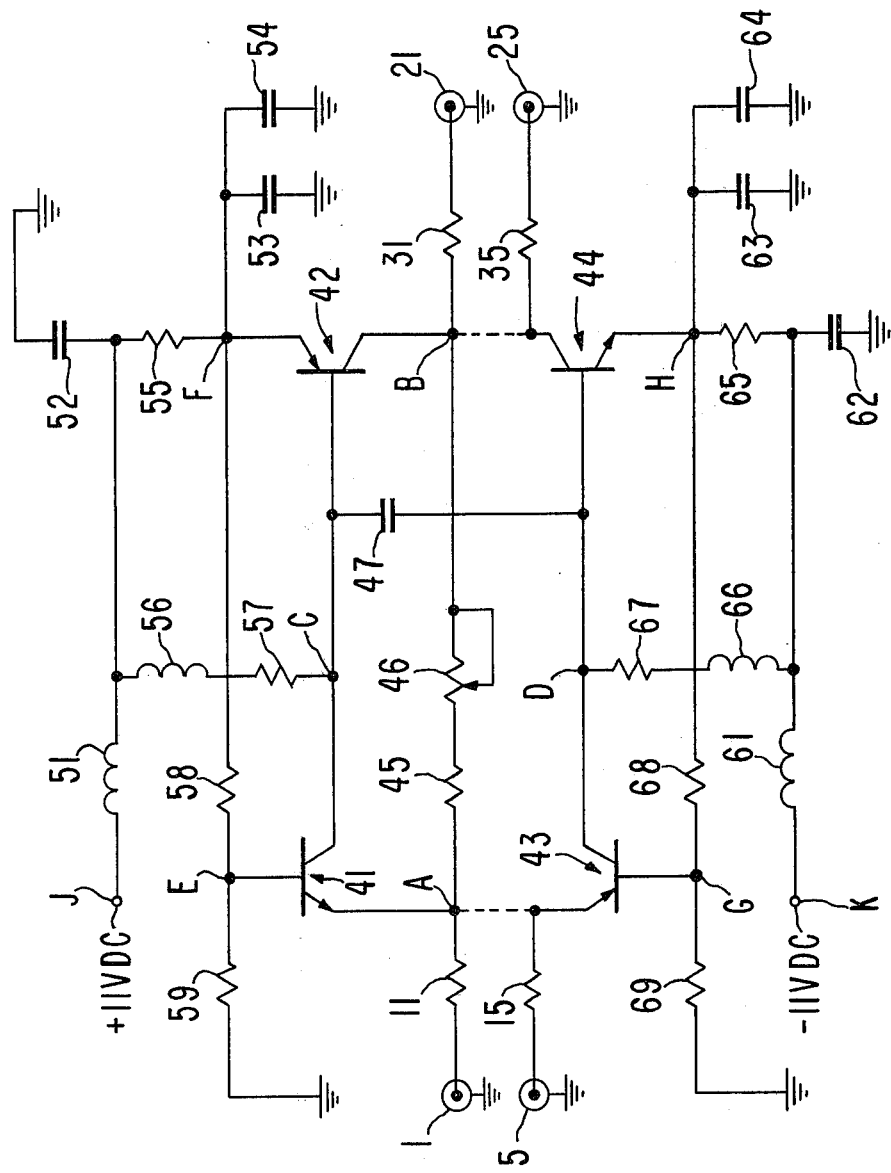

WIDE BANDWIDTH LOW DISTORTION AMPLIFIER

BACKGROUND OF THE INVENTION

1. Field of the Invention

This invention relates to a circuit for a wide bandwidth low distortion amplifier, particularly a class A transistorized amplifier capable of handling high current.

2. Description of the Prior Art

A prior art search has disclosed the following patents:

U.S. Pat. Nos. 2,761,917 and 3,239,770 employ transformer coupling as an integral part of their design. Transformers have bandpass characteristics which inherently limit the bandwidth of the amplifier, and hence limit the usefulness of the amplifier in broadband applications. The present invention is not so limited.

U.S. Pat. No. 3,594,652 does not employ transistors in a complementary relationship, whereas complementary action in the present invention has the effect of causing even order distortion products to cancel. This patent also does not use feedback loops as in the present invention.

U.S. Pat. No. 3,955,259 shows a common-emitter input, not a common-base input as in the present invention. This patent is for a common class A amplifier.

U.S. Pat. No. 2,860,193 drives its first stage common-emitter, not common-base as in the present invention, and does not provide overall feedback from the output collectors as in the present invention.

U.S. Pat. 2,955,257 is a buffer amplifier with unity gain comprising two sets of emitter followers with no feedback.

U.S. Pat. No. 3,372,344 is a unity gain buffer amplifier. It is susceptible to cross-over distortion and even-order distortion due to its asymmetry.

U.S. Pat. No. 2,959,741 is meant as a low-noise low-current front end. It does not employ complementariness.

The following patents were also cited as of general interest: U.S. Pat. Nos. 3,260,947, 3,258,704, 3,040,264, 3,204,191, 2,788,493, 3,195,064, 3,114,112, 3,500,218, and 3,628,166.

SUMMARY OF THE INVENTION

The present invention provides low distortion over a wide bandwidth, e.g., 0 MHz-100 MHz, and excellent VSWR up to 10 MHz. It features adjustable gain of from 0 dB to 6 dB. It has very low distortion; the second order products are down in the Fourier frequency domain, which approximates a sine wave. The DC coupling of the present amplifier enhances its versatility; adding several inputs reduces the bandwidth only slightly while not affecting the gain; and adding several outputs will increase the distortion but slightly.

A first stage comprising two common-base transistors connected in complementary fashion drives a second stage comprising two common-emitter amplifiers connected in complementary fashion. The use of the term "complementary" in a DC coupled amplifier means that for each complementary pair of transistors, one is NPN and the other is PNP. This complementary symmetry balances the outputs from the two complementary halves of the amplifier and almost completely eliminates cross-over distortion.

An AC feedback loop reduces distortion by suppressing nonlinear behavior in the transistors and stabilizes the gain, improving the gain flatness and pulse linearity.

DC feedback paths within each of the complementary halves balance the current between stages within the complementary halves and protect the transistors from current overload.

Because it is broadbanded, the amplifier has good group delay distortion characteristics, i.e., phase shifts at different frequencies are in direct proportion to those frequencies.

A compensating capacitance is employed between complementary halves to further minimize distortion.

BRIEF DESCRIPTION OF THE DRAWING

These and other more detailed and specific objects and features of the present invention are more fully disclosed in the following specification, reference being had to the accompanying drawing in which is shown the circuit of the present invention.

DESCRIPTION OF THE PREFERRED EMBODIMENTS

The Figure shows the circuit of the preferred embodiments. The heart of the invention is a set of four transistors 41, 42, 43 and 44. Transistors 41 and 43 comprise the first stage and are each configured common-base, i.e., their bases are connected, via resistances, to ground. They are connected in complementary fashion, i.e., transistor 41 is an NPN transistor and transistor 43 is a PNP. Alternatively, 41 could be PNP and 43 NPN. For example, transistor 41 can be an NPN 2N5109 and transistor 43 can be a PNP 2N5583.

Similarly, complementariness with respect to the second stage transistors 42 and 44 means that one is a PNP and the other is an NPN. For example, transistor 42 can be a PNP 2N5583 and transistor 44 can be an NPN 2N5109.

In other words, there is complementary symmetry about the AB axis. In particular, values of components above this axis are selected to be equal to values of components below it. In the case of the power supplies, connected at points J and K, there are identical in magnitude but opposite in polarity. In the preferred embodiment shown, the power supply connected at point J is +11 volts DC and the power supply connected at point K is −11 volts DC; but other suitable values could be chosen.

The first stage transistors 41 and 43 are connected common-base via resistors 59 and 69, respectively, to ground. In the embodiment shown, 59 and 69 are each 100 ohms. This common-base configuration gives this stage a wide band characteristic, because the Miller capacitance is not able to reduce the amplification at high frequencies. (Miller capacitance is the inherent feedback capacitance between the collector and base of a transistor.)

Second stage transistors 42 and 44 are connected common-emitter, i.e., their emitters are AC-coupled to ground via capacitors 53 and 54 in the case of transistor 42, and via capacitors 63 and 64 in the case of transistor 44, as shown in the drawing.

In one embodiment, a single input is connected at input coaxial connection point 1, which is coupled to point A via resistor 11, which is typically 50 ohms (a standard 50 ohm transmission cable). Resistance 11 can, however, be 72 ohms or any other reasonable amount. A single output is provided at coaxial connection point 21, which is coupled via resistance 31 to point B. Resistor 31 is typically 50 ohms (standard 50 ohm transmission line) but may be 72 ohms or any other convenient figure.

It is an important feature of the present invention that many inputs (up to five conveniently) may be connected to input point A of the amplifier, each input thereby being amplified. The addition of more inputs does not reduce the bandwidth very much, and, importantly, does not affect the gain at all. This is because the average voltage appearing at point A is held at 0 volts by the feedback from point B. The drawing shows five inputs connected to point A via coaxial connection points 1 through 5, connected via resistors 11 through 15, respectively, each of which is equal in magnitude.

It is another feature of the unique topology of this amplifier that the addition of several outputs (up to five conveniently) will increase the distortion of the amplifier only very slightly. The drawing shows five such outputs connected to point B via coaxial output connection points 21 to 25 connected to resistors 31 to 35, respectively, each of which is equal in magnitude. The fact that the DC voltage at point B is 0, coupled with a very low output impedance, allows this versatility of the output connections.

As is standard practice, the outer cables of coaxial connection points 1 through 5 and 21 through 25 are connected to ground as shown in the drawing.

The path BA, which traverses potentiometer 46 (preferably 50 ohms) and resistor 45 (preferably 82 ohms) allows one to fix and adjust the gain. The BA path constitutes an AC and DC feedback loop. The gain is adjusted by potentiometer 46. The overall gain in the amplifier is approximately equal to $(R_{45}+R_{46})/R_{11}$ where $R_{45}$ is the resistance of 45, $R_{46}$ is the resistance of 46, and $R_{11}$ is the resistance of 11. The gain is typically between 0 dB and 6 dB for the component values given in this specification as typical for the preferred embodiment. As stated earlier, the overall gain does not change depending upon how many inputs are connected at point A: the value of $R_{11}$ always appears in the denominator of the above equation regardless of how many inputs are connected, assuming all the input resistances (e.g., 11 through 15) are equal.

Capacitor 47 is connected between the bases of transistors 42 and 44, typically 2.2 microfarads; it serves to balance the AC levels between these two points (C and D), thereby further minimizing distortion. This capacitor may thus be considered a compensating capacitance.

DC power is supplied to the transistors at points J and K, respectively. The voltages at these points should be equal in magnitude and opposite in sign; in the preferred embodiment, +11 volts is applied at point J and −11 volts is applied at point K. Inductors 51 and 61 in the preferred embodiment are 100 microhenries and serve as high frequency chokes for filtering the power supplies. They are connected at points J and K, respectively. Capacitors 52 and 62 in the preferred embodiment are 1 microfarad each. They serve as AC filter capacitors for the power supplies and are connected between inductors 51 and 61, respectively, and ground. Capacitors 53 and 54, which are connected between point F (the emitter of transistor 42) and ground; and capacitors 63 and 64, which are connected between point H (the emitter of transistor 44) and ground, are coupling capacitors. Capacitors 53 and 63 in the preferred embodiment are each 2.2 microfarads. Capacitors 54 and 64 in the preferred embodiment are 120 microfarad tantalum capacitors which provide the necessary high capacitance; however, these capacitors do not function well at high frequencies, and therefore capacitors 53 and 63 are employed in parallel with capacitors 54 and 64, respectively, to handle the high frequency requirements of the system. Resistors 55 and 65 (in the preferred embodiment 39.2 ohms) are connected between chokes 51 and 61, respectively, and the emitters of transistors 42 and 44, respectively; they provide a desired voltage drop. Resistors 58 and 68 are in the preferred embodiment each 1,000 ohms and are connected between points E and F, and G and H, respectively. Resistors 59 and 69 are in the preferred embodiment 100 ohms each and are connected between point E and ground, and point G and ground, respectively. Together, resistors 58 and 59 constitute an 11 to 1 voltage divider. Similarly, together, resistors 68 and 69 constitute an 11 to 1 voltage divider. Thus, in a quiescent state, 7.7 volts will appear at point F and 0.7 volts will appear at point E. Similarly, −7.7 volts will appear at point H and −0.7 volts will appear at point G.

Inductor 56, which in the preferred embodiment is 1,000 microhenries, is connected at one end to choke 51 and on the other end through resistor 57 (in the preferred embodiment, 68.1 ohms) to point C. The value of resistor 57 is chosen to give the desired voltage drop. Choke 56 gives frequency compensation at the high frequencies by boosting the voltage at point C at these frequencies. Similarly, inductor 66, also preferably 1,000 microhenries, is connected at one end between choke 60 and on the other end via resistor 67 (in the preferred embodiment, 68.1 ohms) to point D, where it also provides frequency compensation at high frequencies for the lower symmetrical half of the amplifier.

There are two DC feedback loops which are important to the operation of this amplifier. The first is the loop F-E-41-42-F. The second is the loop H-G-43-44-H. Since they are equivalent, only the upper loop will be discussed. These loops balance the current between stages within the complementary halves; they also protect the transistors from drawing too much current as follows: if transistor 42 begins drawing too much current, then the voltage at point F will drop. This will cause the voltage at point E to drop, because the voltages at points F and E always have a fixed 11 to 1 relationship with respect to each other. If the voltage at E drops too much, transistor 41 will shut off; this in turn causes transistor 42 to shut off. This protects the circuits from over-currents due to, for example, changes in the thermal environment.

With the above values of the components, the amplifier will exhibit very low levels of distortion for input powers in the area of 0.001 watt. If higher power operation is desired, the values of the components can be adjusted accordingly. If very high power is desired, transformer coupling can be employed between point B and the output connections.

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. An amplifier comprising:

a first stage having two transistors connected common-base, wherein one transistor is NPN and the other is PNP;

a second stage driven by and connected to said first stage having two transistors, one of which is NPN and the other of which is PNP;

a first d.c. feedback loop connecting the NPN transistor of the first stage with the PNP transistor of the second stage; and a second d.c. feedback loop connecting the PNP transistor of the first stage with the NPN transistor of the second stage;

wherein the NPN transistor of the second stage is connected to the PNP transistor of the first stage, and the PNP transistor of the second stage is connected to the NPN transistor of the first stage.

2. The amplifier of claim 1 wherein said second stage transistors are connected common-emitter.

3. The transistor amplifier of claim 2 wherein an AC and DC feedback path is provided between the collectors of the two second-stage transistors and the emitters of the two first-stage transistors.

4. The amplifier of claim 3 wherein said AC and DC feedback path contains a potentiometer for varying the gain of the amplifier.

5. The transistor amplifier of claim 1 wherein the voltages on the emitters of the second-stage transistors are related in a fixed way to the voltages on the bases of the first-stage transistors.

6. The amplifier of claim 1 wherein the bases of the second-stage transistors are connected together via a compensating capacitance.

7. The amplifier of claim 1 wherein several input loads each having the same impedance are connected to the emitters of said first-stage transistors.

8. The amplifier of claim 1 wherein several output loads each having the same impedance are connected to the collectors of said second stage transistors.

9. An amplifier comprising two complementary halves each having two transistors and a DC power supply, wherein:

the first transistor of the first half is PNP whereas the first transistor of the second half is NPN, and the second transistor of the first half is NPN whereas the second transistor of the second half is PNP; and the DC power supply voltages are equal in magnitude but opposite in polarity;

wherein the first transistor of each half is connected common-base; and each half has a d.c. feedback loop connecting the NPN transistor to the PNP transistor of that half, said two d.c. feedback loops being identical to each other.

10. An adjustable-gain wide-bandwidth low-distortion amplifier comprising:

a first stage having an NPN common-base transistor and a PNP common-base transistor, wherein several input loads having identical impedances are each connected to each emitter of said first-stage transistors;

a second stage having an NPN common-emitter transistor whose base is connected to the collector of the first-stage PNP transistor, and a PNP common-emitter transistor whose base is connected to the collector of the first-stage NPN transistor, wherein several output loads having identical impedances are each connected to each collector of said second-stage transistors;

a first resistive path connecting the emitter of the second stage PNP transistor with the base of the first stage NPN transistor; and a second resistive path connecting the emitter of the second stage NPN transistor with the base of the first stage PNP transistor.

* * * * *